(12) United States Patent
Ramusch et al.

(10) Patent No.: US 7,721,921 B2
(45) Date of Patent: May 25, 2010

(54) TAP UNIT FOR A BEVERAGE DISPENSER

(75) Inventors: Adolf Ramusch, Klagenfurt (AT); Peter Haefele, Unterbergen (AT); Marc Igerc, Klagenfurt (AT)

(73) Assignee: Koninklijke Philips Electronics N.V., Eindhoven (NL)

( * ) Notice: Subject to any disclaimer, the term of this patent is extended or adjusted under 35 U.S.C. 154(b) by 625 days.

(21) Appl. No.: 11/579,837

(22) PCT Filed: May 11, 2005

(86) PCT No.: PCT/IB2005/051545

§ 371 (c)(1),
(2), (4) Date: Nov. 7, 2006

(87) PCT Pub. No.: WO2005/110912

PCT Pub. Date: Nov. 24, 2005

(65) Prior Publication Data

US 2008/0023501 A1 Jan. 31, 2008

(30) Foreign Application Priority Data

May 14, 2004 (EP) ............................... 04102131

(51) Int. Cl.
*B67D 7/06* (2010.01)
(52) U.S. Cl. .................... 222/505; 222/212; 222/400.7; 251/4

(58) Field of Classification Search .................. 222/505, 222/212, 213, 400.7, 400.8, 137; 251/9, 251/10, 4
See application file for complete search history.

(56) References Cited

U.S. PATENT DOCUMENTS

| 2,549,207 | A | * | 4/1951 | Kestenbaum | ............... 222/131 |
| 3,016,916 | A | * | 1/1962 | Kraft | .......................... 137/889 |
| 3,727,640 | A | * | 4/1973 | Sargeant | ...................... 137/889 |
| 3,949,903 | A | * | 4/1976 | Benasutti et al. | .......... 222/129.2 |
| 4,186,848 | A | * | 2/1980 | Walter | .......................... 222/23 |
| 5,022,565 | A | * | 6/1991 | Sturman et al. | ............. 222/396 |
| 5,979,713 | A | * | 11/1999 | Grill | ............................ 222/399 |
| 6,988,675 | B2 | * | 1/2006 | Hubmann et al. | ........... 239/310 |
| 7,178,699 | B2 | * | 2/2007 | Spray et al. | .................. 222/212 |
| 2007/0056990 | A1 | * | 3/2007 | Pakkert et al. | ............ 222/146.6 |

FOREIGN PATENT DOCUMENTS

| GB | EP0272906 A2 | * | 6/1988 |
| WO | WO0192145 A1 | * | 6/2001 |
| WO | WO 01 92145 | | 12/2001 |

* cited by examiner

*Primary Examiner*—Kevin P Shaver
*Assistant Examiner*—Robert K Nichols, II (57) ABSTRACT

The present invention relates to a cartridge unit for a beverage dispensing system with an inner channel for the dispensation of a beverage, characterized in that the cartridge unit comprises a first part, which is made of an inflexible material and a second part, which is made of a flexible material.

9 Claims, 10 Drawing Sheets

TAP UNIT FOR A BEVERAGE DISPENSER

The present invention relates to the field of beverage dispensing systems, especially beverage dispensing systems which use a container, within which a beverage is stored, the beverage being dispensed from the container with the aid of pressure.

In the present beverage dispensing systems, the container, which stores the beverage to be dispensed, has an opening for dispensing the beverage. In most applications this beverage is carbonated or has the tendency to foam; this applies especially to beverage dispensing systems which are adapted for the dispensation of beer.

In these beverage dispensing systems, it is a problem that inside the container there exists usually an overpressure. This causes the beverage to "spill" over when the opening of the container is opened and a cartridge is inserted, thus causing quite an amount of foam if the beverage is carbonated or has the tendency to foam. Furthermore, the cartridge must be adapted to guarantee a steady flow of beverage from the container.

The solutions as known in the art, e.g. from the WO 01/92145 are directed to a dispensing system with a valve having a tap-ball. For hygienic reasons, the cartridge is changed with every new keg of beverage, especially in case that the beverage is beer. In order to achieve this, the tap-ball of the valve is opened to put the cartridge tube through, which made as a single flexible tube. Due to the material of the cartridge tube, this operation is not very easy to be achieved. Furthermore, there is a strong tendency of foaming when a new keg is opened.

It is therefore an object of the invention to provide a cartridge unit for a beverage dispensing system, which is capable to provide for a safe and efficient delivery of beverage from the container, while the amount of foam produced is reduced.

This object is achieved by a cartridge unit according to claim 1 of the present application. Accordingly, a cartridge unit for a beverage dispensing system with an inner channel for the dispensation of a beverage is provided, characterized in that the cartridge unit comprises a first part, which is made of an inflexible material, and a second part, which is made of a flexible material. Preferably, the first, inflexible part is introduced or put into the opening of the container, whereas the second, flexible part serves to deliver the beverage to the outside.

Due to the inflexible part of the cartridge unit, an initial overpressure inside a new keg does not lead to foaming of the beverage in such an amount as in the prior art, since the inflexibility of the unit allows the pressure to be released in a quick and smooth way.

Preferably, the inflexible part of the cartridge unit comprises a vertical part, which extends essentially upward if the container stands upright and the cartridge unit is inserted into the container. This inflexible part comprises an inner channel for the delivery of beverage. The preferred flow of beverage, in case a beverage is to be delivered through the cartridge unit, is $\geq 1$ l/min and $\leq 3$ l/min, more preferably $\geq 1.5$ l/min and $\leq 2.5$ l/min. This ensures a low amount of foaming, especially in case the beverage is beer.

Preferably, the inflexible part of the cartridge unit comprises a cylindrical part, which is preferably connected to the vertical part and/or attached to it. This cylindrical part preferably extends sidewards from the vertical part and forms an angle of $\geq 50°$ and $\leq 90°$, preferably $\geq 60°$ and $\leq 80°$. The cylindrical part preferably has an inner channel with a diameter small enough to cause a reduction of pressure due to overpressure in the container. Preferably, the inner diameter of this inner channel is $\geq 1.0$ mm and $\leq 2.5$ mm, preferably $\geq 1.5$ mm and $\leq 2.0$ mm, and is preferably uniform over the total length of the cylindrical part. The length of the cylindrical part is preferably $\geq 20$ mm and $\leq 80$ mm, more preferably $\geq 30$ mm and $\leq 70$ mm and most preferably $\geq 35$ mm and $\leq 60$ mm. By doing so, an overpressure can be effectively released without causing foaming of the beverage.

Preferably, the inflexible part of the cartridge unit comprises a conical part, which is preferably connected to the cylindrical part and/or attached to it. Furthermore, it is preferred that the conical part is connected to the flexible part of the cartridge unit and/or attached to it.

Furthermore, the conical part comprises an inner channel for the delivery of the beverage. It is preferred that the inner diameter of this inner channel increases towards the flexible part of the cartridge unit. Preferably, the inner diameter of this inner channel is $\geq 1.0$ mm and $\leq 2.5$ mm, preferably $\geq 1.5$ mm and $\leq 2.0$ mm at the minimum point. It is preferred that this minimum point is close to the junction between the conical part and the cylindrical part of the inflexible part of the cartridge unit, if a cylindrical part is present. The length of the conical part is preferably $\geq 20$ mm and $\leq 120$ mm, more preferably $\geq 30$ mm and $\leq 80$ mm and most preferably $\geq 35$ mm and $\leq 100$ mm Furthermore, it is preferred that the inner channel of the conical part forms a cone in such a way that the inner diameter of the inner channel widens toward the flexible part of the cartridge unit. Preferably, the taper angle and/or cone angle is preferably $\geq 0°$ and $\leq 15°$, more preferably $\geq 3°$ and $\leq 10°$ and most preferably $\geq 6°$ and $\leq 8°$. This ensures a very smooth passage of the beverage through the cartridge unit.

In the case that the cartridge unit comprises a conical part and a cylindrical part, it is preferred that the relation of the conical part to the cylindrical part is $\geq 0.8:1$ and $\leq 2:1$, preferably $\geq 1:1$ and $\leq 1:5$. This ensures a very smooth passage of the beverage through the cartridge unit.

Furthermore, the inner channels of the cartridge unit are preferably essentially free of burs. This ensures that foaming due to interaction with the burs does not occur.

The inner channel of the inflexible part of the cartridge, especially in the conical and/or cylindrical part, may have any given cross-sectional profile. The inner channel may be tube-like (in this case, the cross-sectional profile would be a circle or an ellipsoid), however, also square and/or rectangular or any other profiles may be used. In the case that a non-circular cross-sectional profile is chosen for the conical part, it is preferred that the taper angle and/or cone angle is preferably $\geq 0°$ and $\leq 15°$, more preferably $\geq 3°$ and $\leq 10°$ and most preferably $\geq 6°$ and $\leq 8°$ for any given direction inside the inner channel.

It should further be noted that the cross-section of the flexible part will in most applications be circular (e.g. the flexible part will be like a tube), so the cross-sectional profile of the inner channel of the inflexible part of the cartridge will preferably change along the conical part and/or the cylindrical part, in the case that a non-circular cross-sectional profile is used for the conical part and/or the cylindrical part. In this case, it is preferred that this change occurs at or close to the point of linkage between the conical part and the flexible part of the cartridge.

The invention furthermore relates to a beverage dispensing system for use with a cartridge unit as described above, which beverage dispensing system, furthermore, is connectable to a container in which the beverage is stored, which is adapted to receive one end of the cartridge unit for the dispensation of beverage, whereby beverage can be dispensed from the container via the cartridge unit, and the system furthermore comprising:

a valve means, which is adapted to open and/or close the flow of beverage by interaction with the second flexible part of the cartridge unit upon shifting a valve control means from an "open" to a "closed" position, wherein the beverage dispensing system furthermore comprises an installation means, which, when the valve control means is in the "closed" position", keeps the valve means in the open position, when the cartridge unit is not inserted in the container, but closes the valve means, when the cartridge unit is inserted into the container.

By doing so, it is effectively achieved that no overflow of beverage occurs when the cartridge unit is inserted into the container. The container preferably has an overpressure of $\geq 1$ bar and $\leq 1.8$ bar, preferably $\geq 1.2$ bar and $\leq 1.5$ bar. So, if the cartridge unit is inserted, the installation means prohibits an overflow of beverage, since the valve means interrupts the flow of beverage to the outside.

According to another preferred embodiment of the present invention, the closing of the valve, when the cartridge unit is inserted into the container, is achieved in that the first inflexible part of the cartridge unit interacts with a lever means, which shifts the valve from the open to the closed position.

According to another preferred embodiment of the present invention, the installation means comprises a holding means, which keeps the valve in the open position when the cartridge unit is not inserted in the container.

According to another preferred embodiment of the present invention, the valve control means is a handle. This provides the user with an easy and comfortable way of controlling the valve means of the beverage dispensing system.

According to another preferred embodiment of the present invention, the valve control means is a removable handle. It is thus prevented that children can make unauthorized use of the beverage dispensing system.

According to another preferred embodiment of the present invention, the installation means comprises a cushioning means, which prevents movement of the cartridge unit via the lever means in case the valve control means is shifted.

According to another preferred embodiment of the present invention, the beverage dispensing system further contains a fixation means, which keeps the valve control means in a fixed position in the case that the cartridge unit is not inserted.

The aforementioned components, as well as the claimed components and the components to be used in accordance with the invention in the described embodiments, are not subject to any special exceptions with respect to their size, shape, material selection and technical concept, so that the selection criteria known in the pertinent field can be applied without limitations.

Additional details, characteristics and advantages of the object of the invention are disclosed in the subclaims and the following description of the respective Figures—which—in an exemplary fashion—show several preferred embodiments of the cartridge unit and beverage dispensing system according to the invention.

Figure 1:
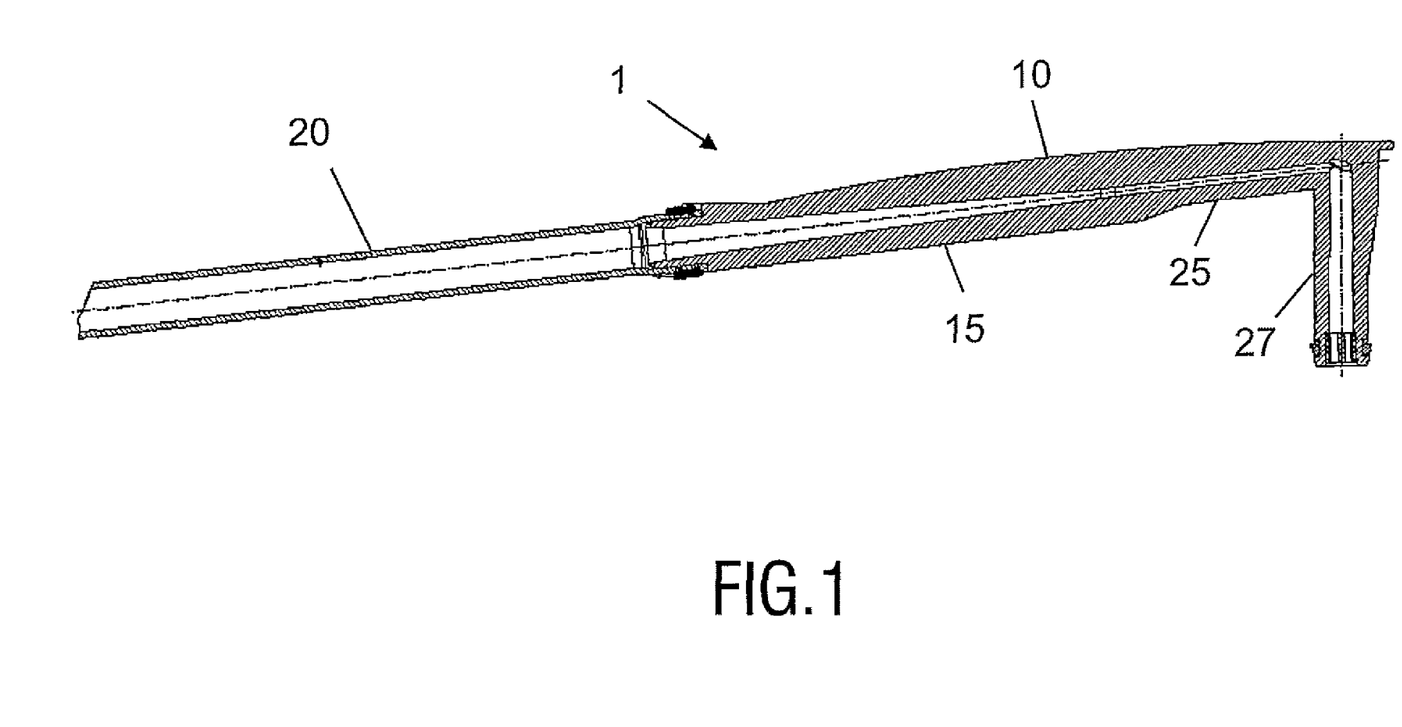
FIG. 1 shows a cross sectional view of a cartridge unit according to a first embodiment of the present invention.

FIG. 1 shows a cross sectional view of a cartridge unit 1 according to a first embodiment of the present invention. As can be seen from FIG. 1, a cartridge unit according to the present invention comprises an inflexible part 10 and a flexible part 20. Preferably, the inflexible part 10 comprises a conical part 15, in which the diameter of the inner tube, which is used for the dispensation of the beverage, increases towards the flexible part 20, a cylindrical part 25, which is attached to the conical part, and a vertical part 27, which is used for the connection between the cartridge unit 1 and the container (not shown in the Figs.). The cartridge unit is provided as described above.

Figure 2:
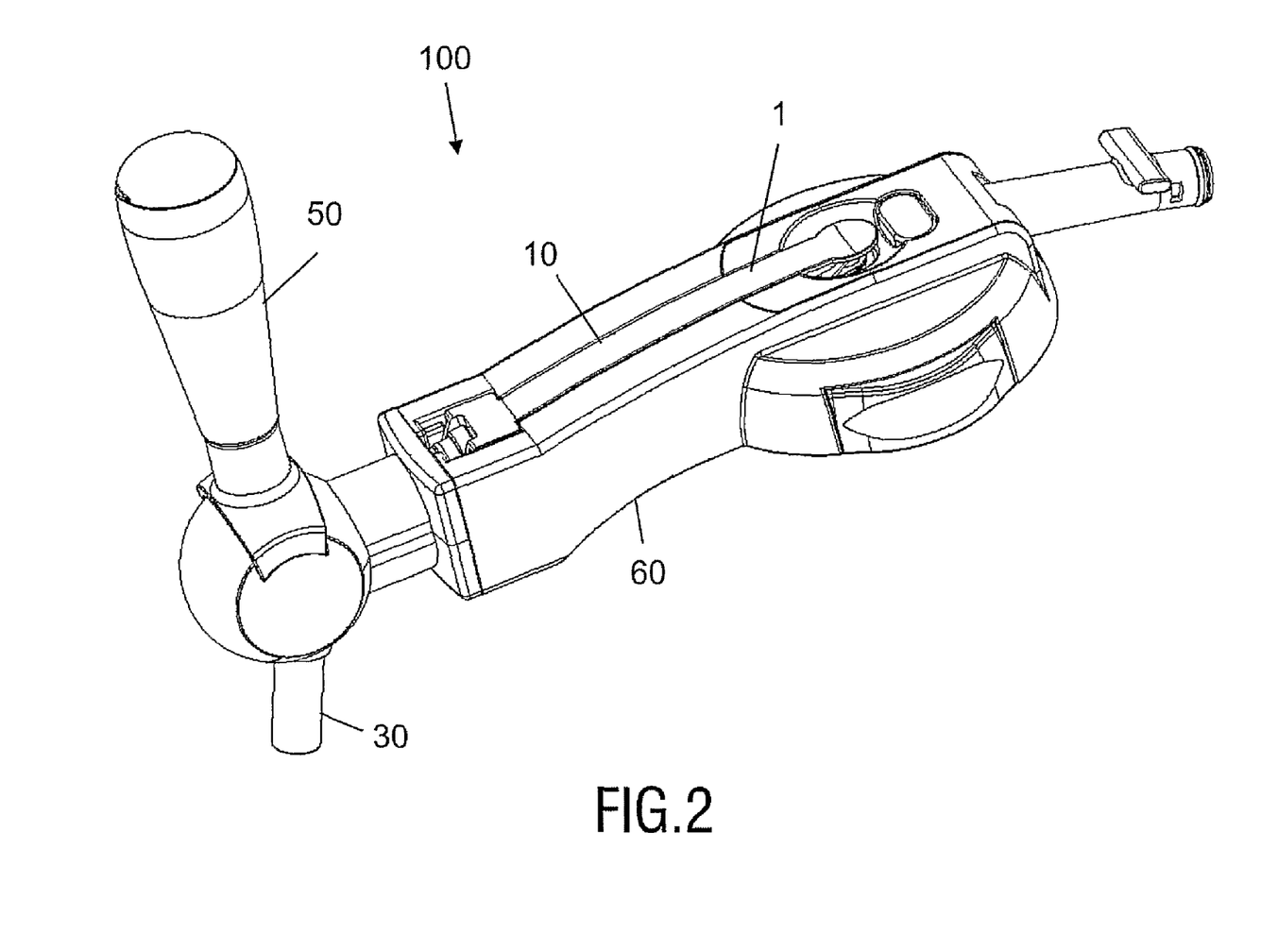
FIG. 2 shows the dispensing part of a beverage dispensing system according to a first embodiment of the present invention.

FIG. 2 shows the dispensing part 100 of a beverage dispensing system according to a first embodiment of the present invention. This dispensing part comprises a housing 60 for the cartridge unit 20, which can then be used for the dispensation of the beverage through the second channel 30. Furthermore, the dispensing part 100 comprises a valve control unit, preferably in the form of a handle, for controlling the flow of the beverage. According to a preferred embodiment of the present invention, the handle is removable. By virtue thereof, the beverage dispensing system can be protected against unauthorized use by children.

Figure 3:
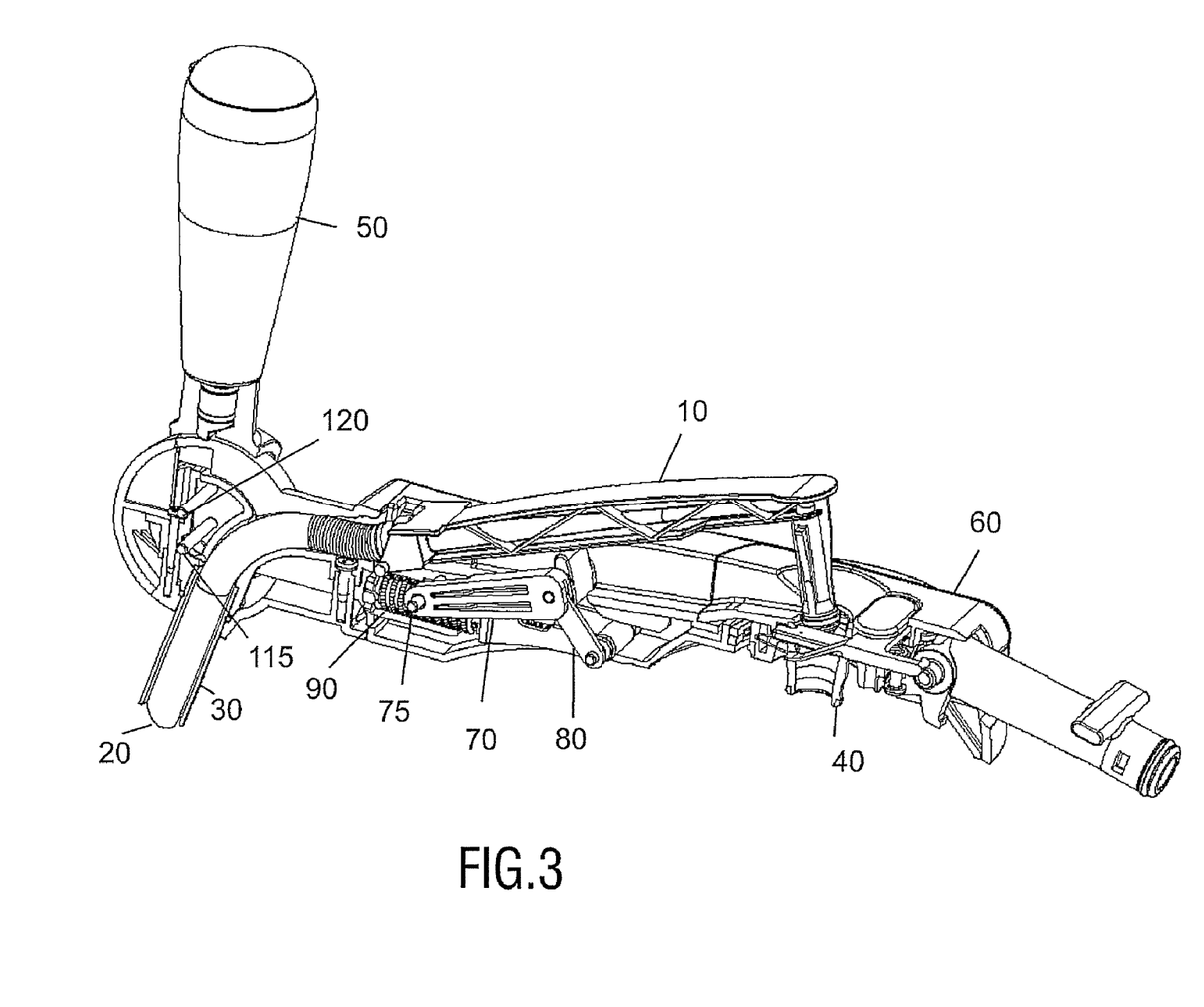
FIG. 3 shows a perspective, partial cut-out view of the beverage dispensing system of FIG. 2 with the cartridge unit in the process of being introduced.
Figure 4:
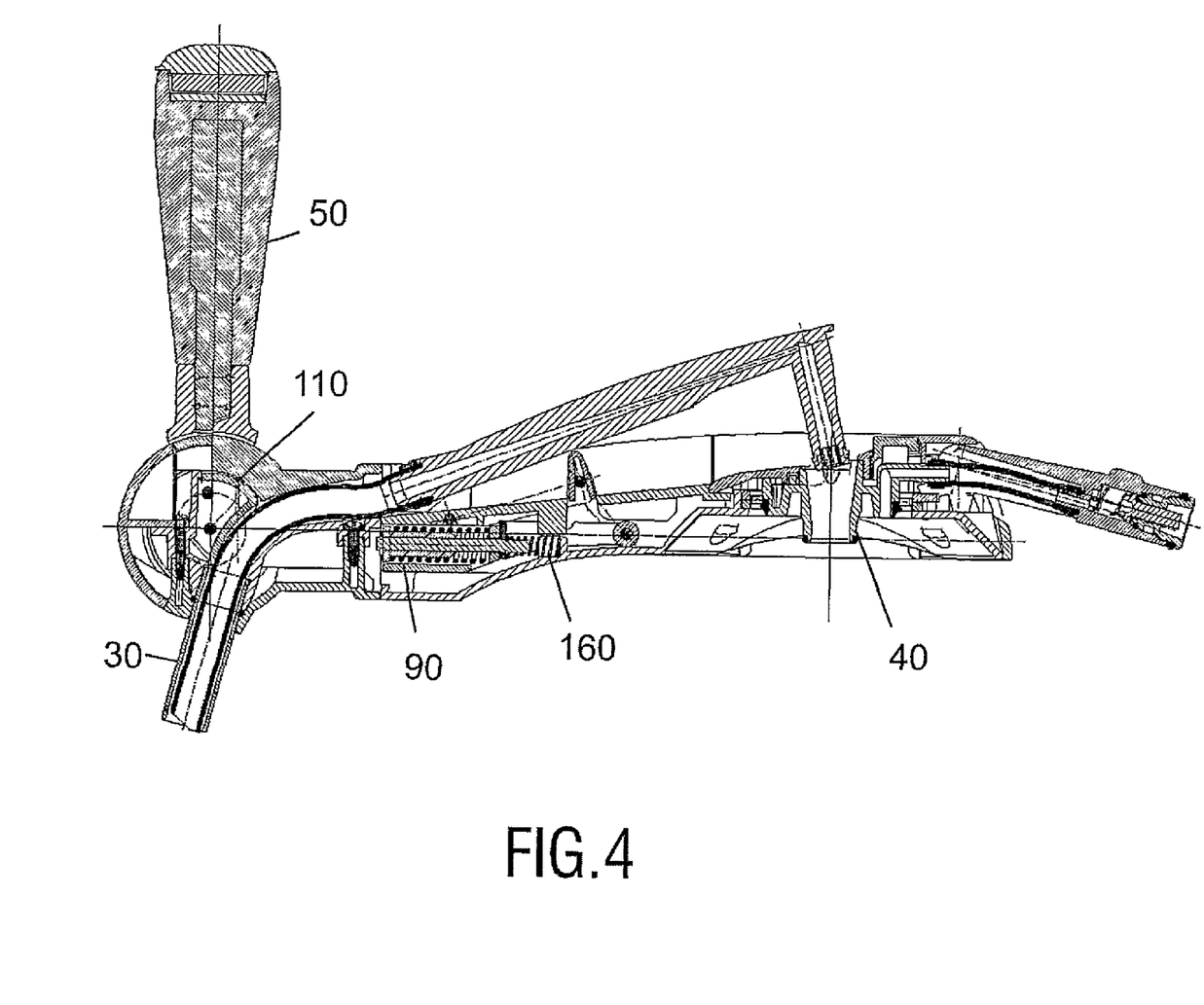
FIG. 4 shows a cross-sectional view of the arrangement of FIG. 3.
Figure 5:
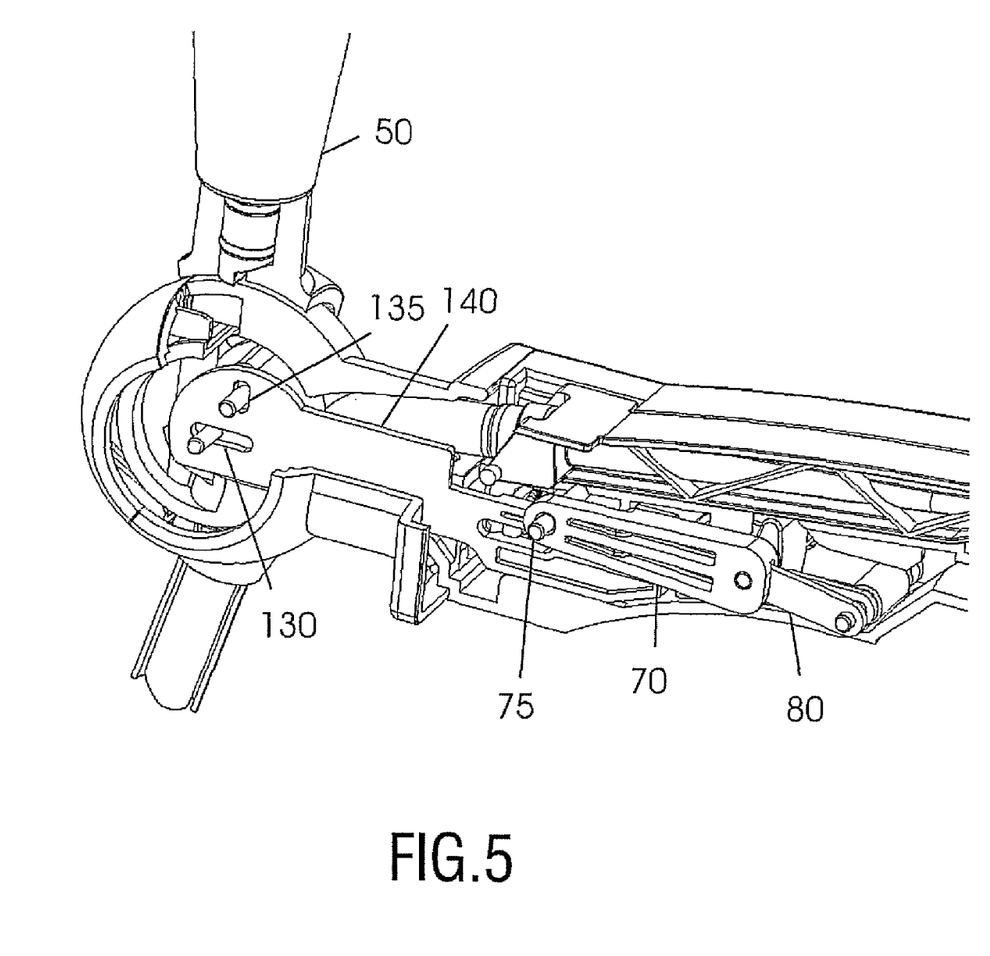
FIG. 5 shows a perspective, partial cut-out view of the beverage dispensing system of FIG. 2 with the cartridge unit totally inserted.
Figure 6:
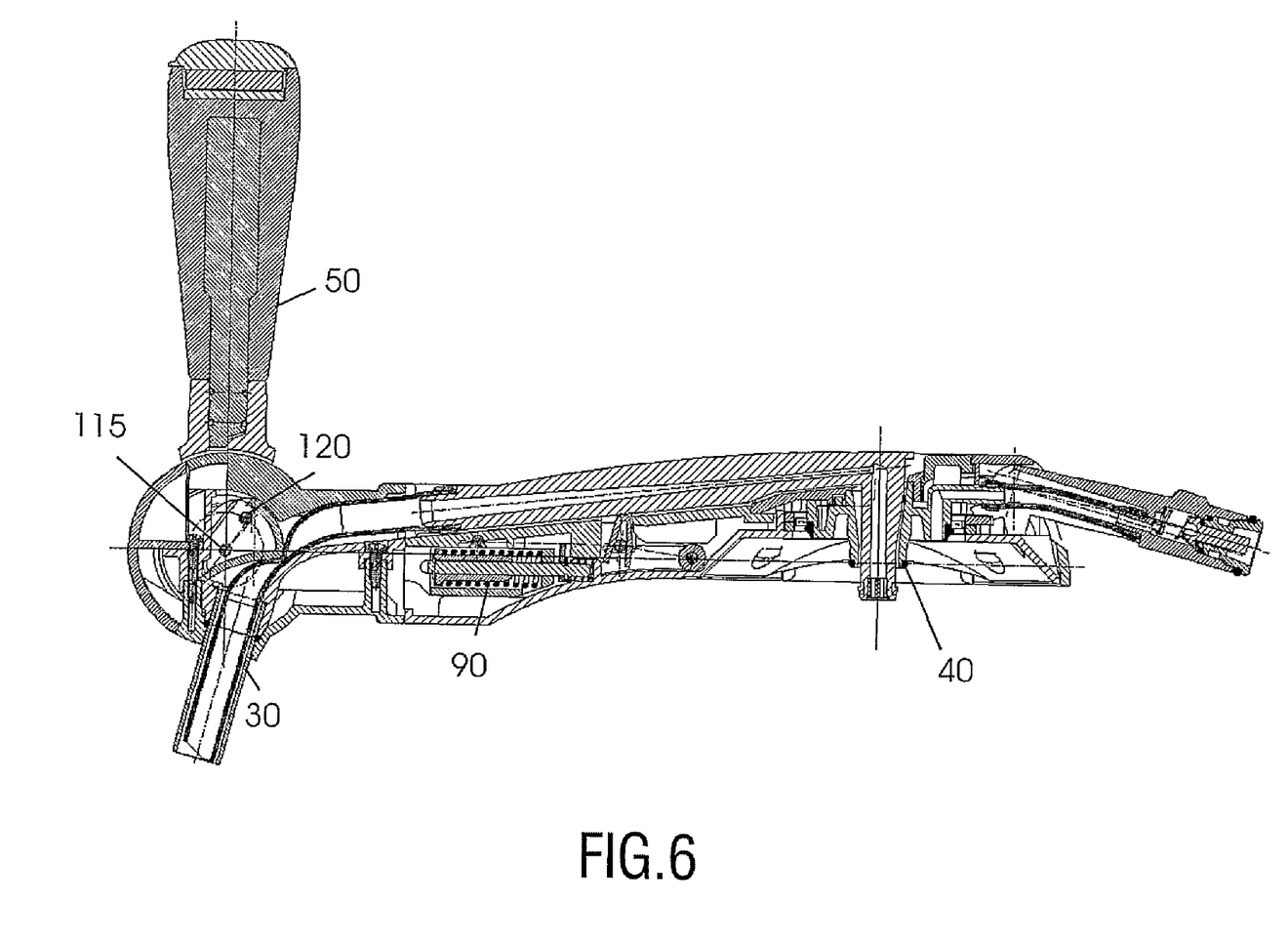
FIG. 6 shows a cross-sectional view of the arrangement of FIG. 5.
Figure 7:
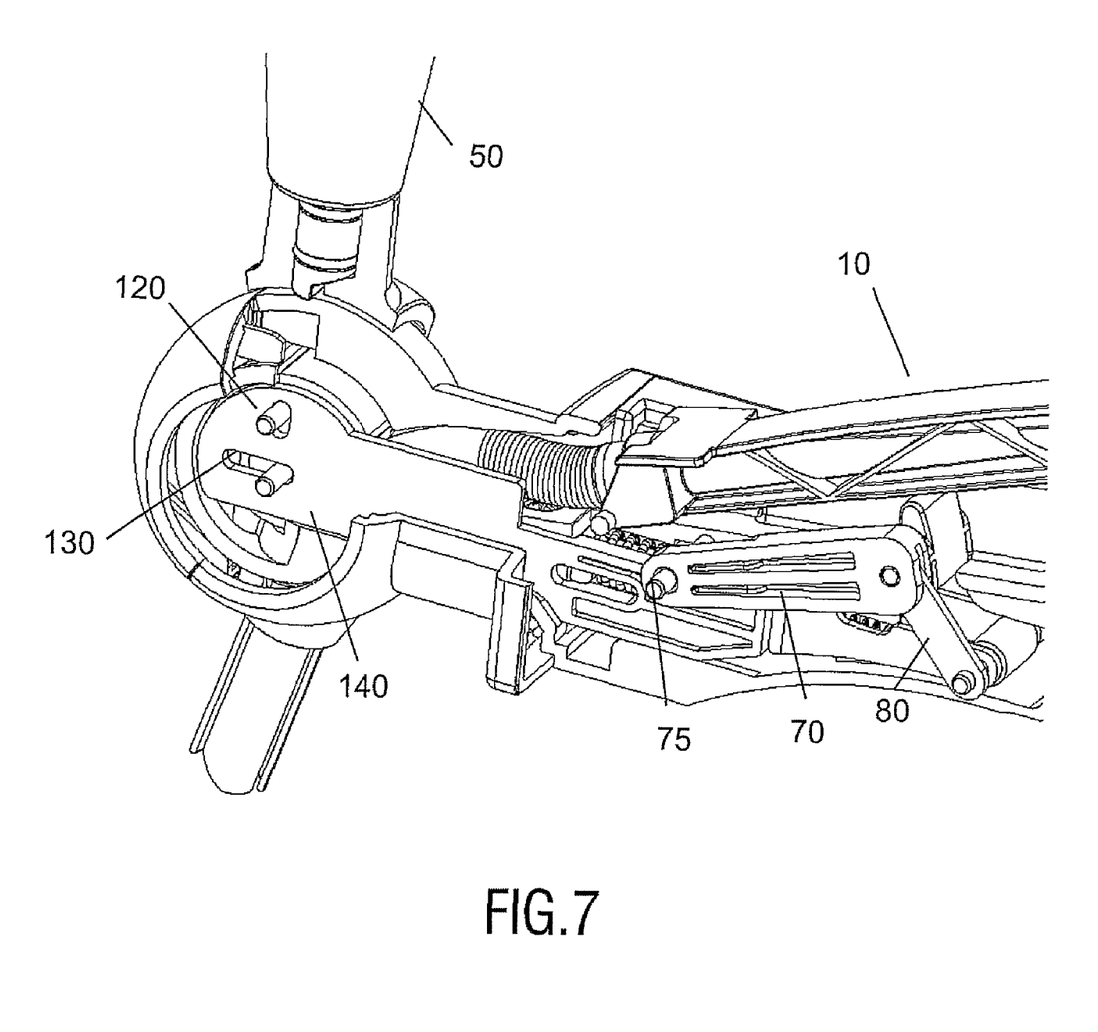
FIG. 7 shows a perspective, detailed, partial cut-out view of the beverage dispensing system of FIG. 2, and it furthermore shows the sliding means in greater detail.
Figure 8:
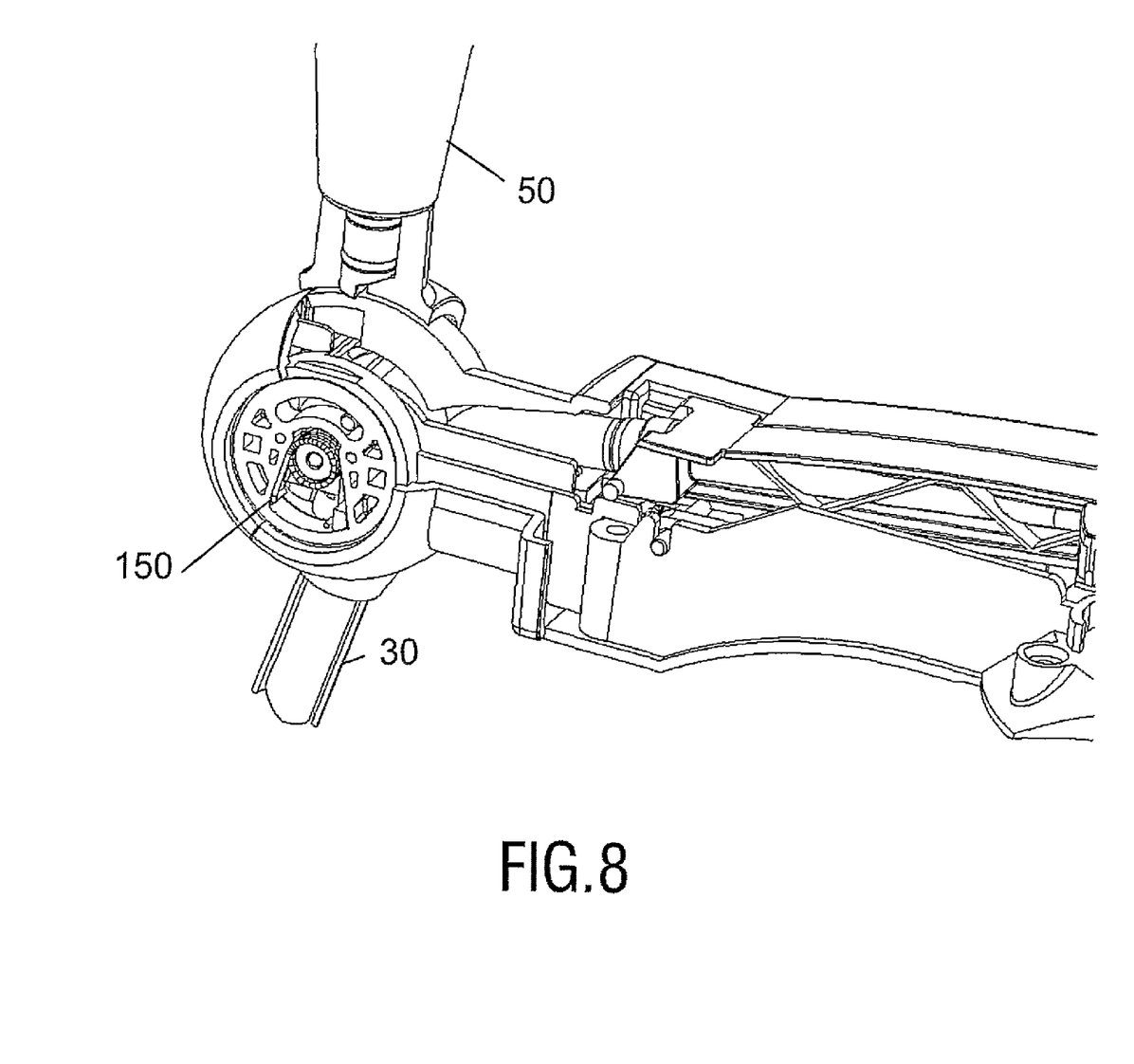
FIG. 8 shows a perspective, detailed, partial cut-out view of the beverage dispensing system of FIG. 2, and it furthermore shows the fixation means in greater detail.

FIG. 3 shows a perspective, partial cut-out view of the beverage dispensing system of FIG. 2 with the cartridge unit in the process of being introduced. FIG. 4 shows a cross-sectional view of the arrangement of FIG. 3. FIG. 5 shows a perspective, partial cut-out view of the beverage dispensing system of FIG. 2 with the cartridge unit totally inserted; FIG. 6 shows a cross-sectional view of the arrangement of FIG. 5. As can be seen especially from FIG. 6, the beverage can be dispensed, using the beverage dispensing system according to the present invention, from the first channel 40 via the cartridge unit 1, which first channel is used for connecting the cartridge unit with the container (not shown in the Figs.) to the second channel 30, which guides the end part of the flexible part 20 of the cartridge unit 1. If the handle 50 is in the "closed" position, the closing means 110 blocks the flow of beverage by biasing, in this case compressing, the flexible part 20 of the cartridge unit 1.

As can be seen from FIGS. 3 to 7, the beverage dispensing system furthermore comprises an installation means, which, when the valve control means (in this case, the handle 50) is in the "closed" position", keeps the valve in the open position when the cartridge unit is not inserted in the container, but closes the valve when the cartridge unit is inserted into the container. This is achieved in the following way:

The installation means of the beverage dispensing system according to the present invention comprises a lever means with two levers 70,80 and a sliding means 140. The lever 70 is rotatably mountable along or with pin 75, which is held in a fixed position by the housing. Furthermore, the beverage dispensing system comprises a closing means 110, which is adapted to stop the flow of beverage by biasing the flexible part 20 of the cartridge unit 1, when the cartridge unit 1 is fully inserted. The closing means 110 comprises two pins 120 and 115, which fit into two cavities 135, 130 of the sliding means 140. The closing means 110 is provided in such a way that it can be rotatably mounted along/with pin 115, which is held in a fixed position by the housing 60, thereby biasing, in this case compressing, the flexible part 20 of the cartridge unit. Furthermore, the installation means comprises two spring means 90, 160.

When the cartridge unit 1 is about to be inserted into the beverage dispensing system, the closing means is in an "open" position, i.e. the flexible part 20 of the cartridge unit 1 can be freely moved within the second channel 30. This is usually done first, thereby essentially achieving a position of the cartridge unit as shown in FIG. 3. The cartridge unit is now moved through the first channel 40 towards the container. By this movement, the inflexible part 10 of the cartridge unit 1 pushed onto the first lever 70. Since this lever 70 is only movable around pin 75, it will move the second lever 80, which will then cause the sliding means 140 to move "backwards", i.e. towards the first channel 40. By this movement, the sliding means 140 will cause the pin 120 to move, since it is inserted in the cavity 135 of the sliding means. Since the pin 115 may not be moved in or from the direction of the first channel 40 (i.e. perpendicular to the cross-sectional plane of FIGS. 4 and 6), the cavity 130 is provided so as to be elongated in order to allow movement of the sliding means 140.

The second lever 80 and the sliding means 140 are connected to each other via a spring means 90. This connection is preferably accomplished in such a way that the movement of the sliding means 140 (and therefore the closing of the closing means 110) is achieved before the cartridge unit 1 is fully inserted. Therefore, a further movement of the cartridge unit 1 will cause the spring means 90 to become tensioned. The spring means 90 therefore serves as a cushioning means, which prevents movement of the cartridge unit via the lever means in case the valve control means is shifted.

Figure 9:
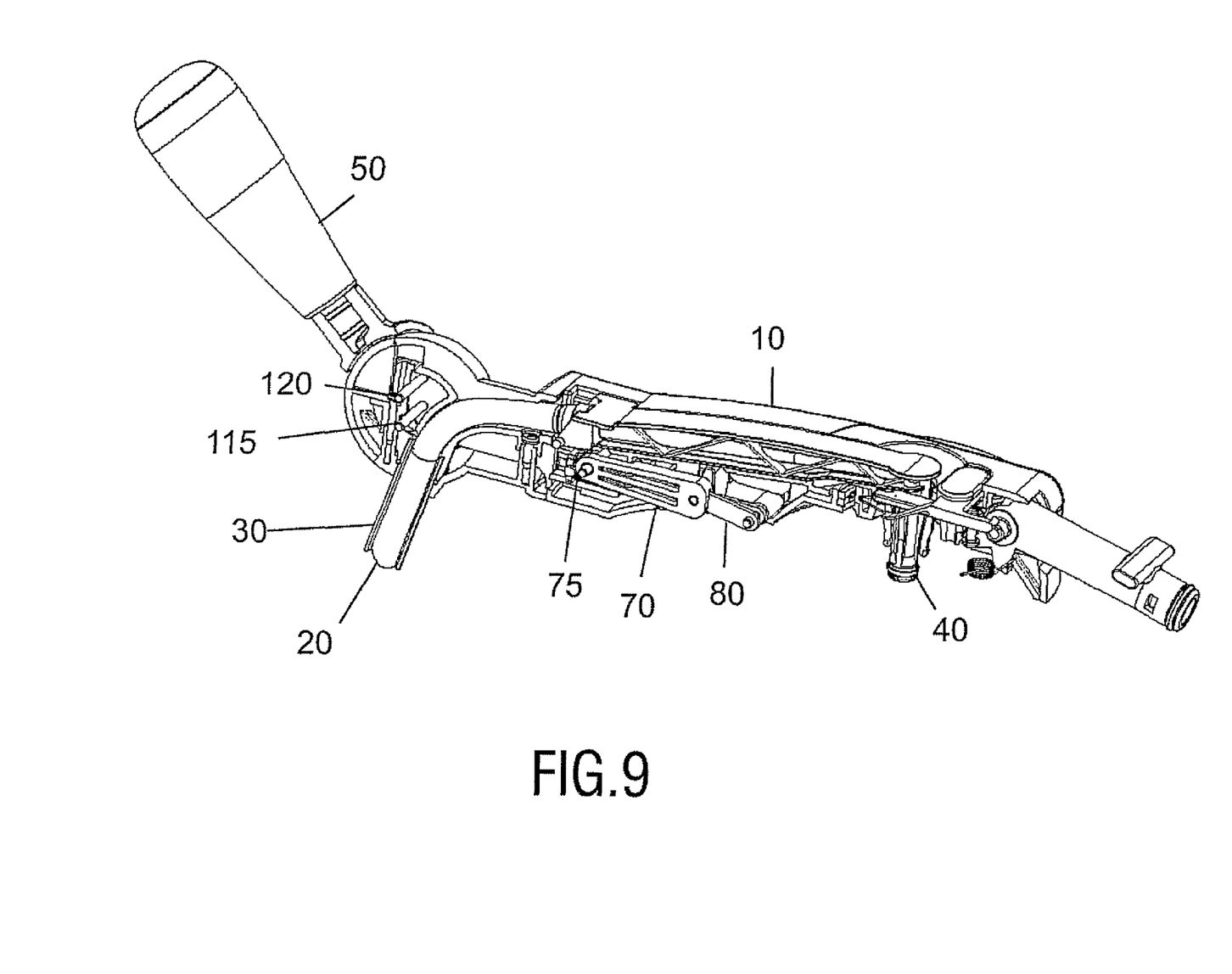
FIG. 9 shows a perspective, partial cut-out view of the beverage dispensing system of FIG. 2 with the cartridge unit totally inserted and the valve control means in the "open position"
Figure 10:
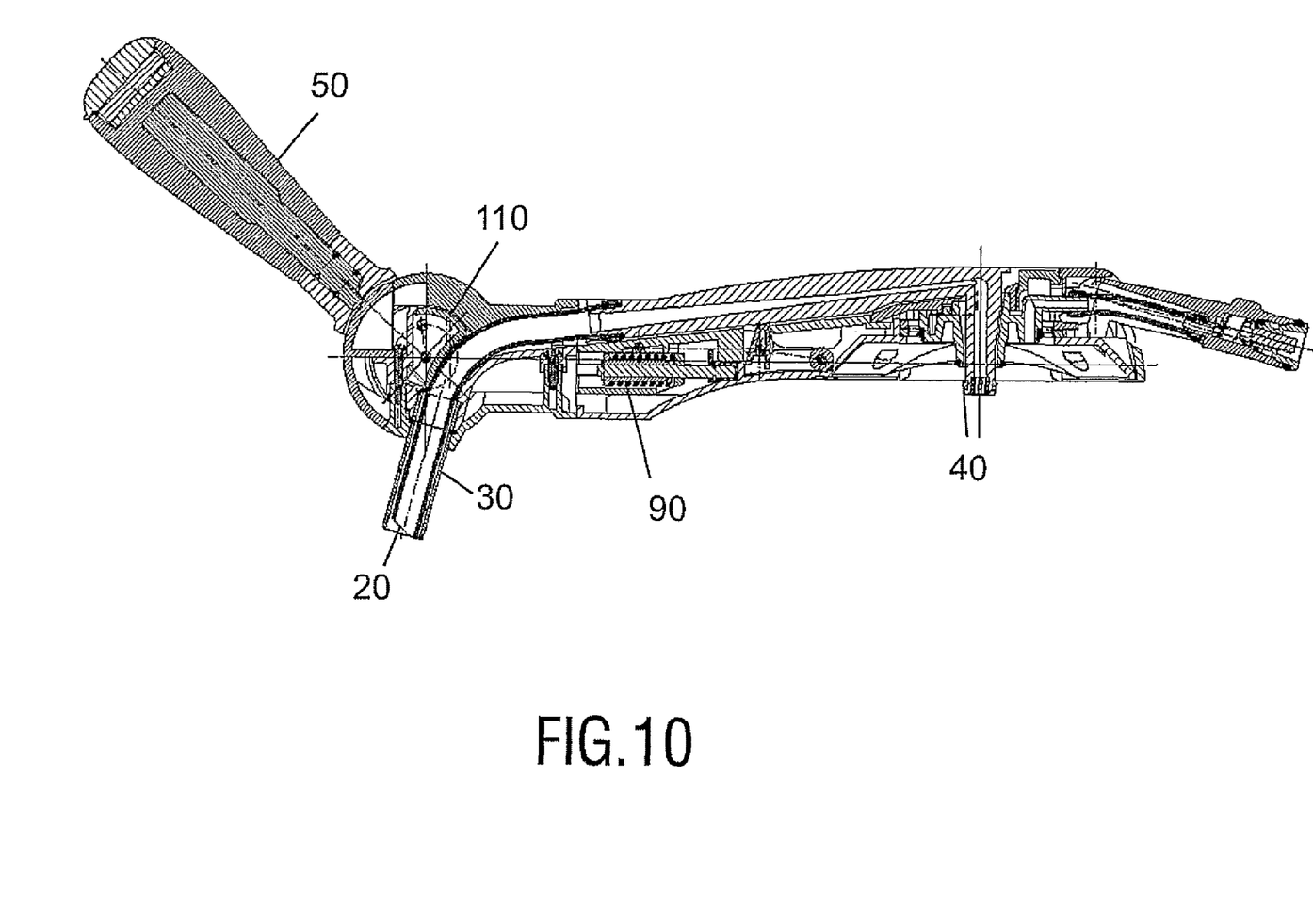
FIG. 10 shows a cross-sectional view of the arrangement of FIG. 9.

If the handle 50 is moved in order to cause beverage (see FIGS. 9 and 10) to flow out of the beverage dispensing system via the cartridge unit 1, the handle 50 will cause the closing means 110 to move "forward" i.e. away from the second channel 40. In this case, the sliding means 140 is also moved "forward", since it is connected with the closing means 110 by the pin 115 and the cavity 130. In this case, the spring means 90 will be stressed. Preferably, the installation means is arranged in such a way that the handle 50 may be moved to fully open the closing means 110 before the spring means 90 is fully stressed. The second lever 80 is fixed.

However, it should be noted that, in this embodiment, the spring means 90 also allows for the valve control means 50 to control the flow of beverage via the closing means 110. In the present embodiment of the present invention, the cartridge 1 is held in the housing 60 by holding means (not shown in the Figs). So, without the spring means 90 there would be no movement of the closing means 110 when the user tries to move the valve control means 50. A movement of the valve control means 50 would cause (via the closing means 110, the sliding means 140 and the lever 80) the lever 70 to press against the cartridge 1. However, since this cartridge is held by the holding means, the movement would be blocked, thereby allowing no movement whatsoever of the valve control means 50. The spring means 90 allows for an independent movement of the valve control means 50 (and the sliding means 140 and closing means 110) against the levers 80 and 70. So, by using the valve control means 50, the flow of beverage can be controlled.

The installation means keeps the valve and/or the closing means 110 in the "open" position, when the cartridge unit is not inserted in the container. This is achieved by the spring means 160, which pushes the second lever 80, and thereby the sliding means 140 and closing means 110, in the "open" position, in case no cartridge unit is inserted. The spring means 160 therefore serves as a holding means, which keeps the valve in the open position, when the cartridge unit is not inserted in the container. For the proper use of the beverage dispensing system, it is preferred that the spring constant and/or the strength of the spring means 160 is much lower than that of the spring means 90.

The handle 50 preferably also has a cavity or hole to enable biasing of the pin 120. This cavity is preferably provided in such a way that it allows free movement of the closing means 110 and the sliding means 140 during the insertion of the cartridge unit. However, by moving the handle 50, when the cartridge unit is inserted, the closing means 110 is moved via biasing of the pin 120, thereby allowing the flow of beverage. In order for the handle 50 to remain in a fixed position during the insertion of the cartridge unit, the handle 50 comprises a fixation means, preferably in the form of a spring 150, which keeps the handle 50 in a fixed position, preferably the "closed" position, when no cartridge unit is inserted.

The invention claimed is:

1. A beverage dispensing system, comprising:
    a cartridge unit for the beverage dispensing system with an inner channel for the dispensation of a beverage, characterized in that the cartridge unit comprises a first part, which is made of an inflexible material, and a second part, which is made of a flexible material, wherein the beverage is dispensed from the second part; and
    a dispensing portion which is connectable to a container in which the beverage is stored and is adapted to receive one end of the cartridge unit for the dispensation of beverage, whereby beverage can be dispensed from the container via the cartridge unit, wherein the dispensing portion includes,
        a valve means, which is adapted to open and close the flow of beverage by interaction with the second flexible part of the cartridge unit upon shifting a valve control means from an "open" to a "closed" position, and
        an installation means, which, when the valve control means is in the "closed" position, keeps the valve means in the open position, when the cartridge unit is not inserted in the container, but closes the valve means, when the cartridge unit is inserted into the container.

2. The beverage dispensing system according to claim 1, wherein the inflexible part of the cartridge unit comprises a conical part which is attached to or connected to the flexible part, the conical part comprises an inner channel which forms a cone in such a way that an inner diameter of the inner channel widens toward the flexible part of the cartridge unit and a taper angle or a cone angle is $\geq 0°$ and $\leq 15°$.

3. A beverage dispensing system for use with a cartridge unit having an inner channel for the dispensation of a beverage, the cartridge unit comprising a first part made of an inflexible material, and a second part made of a flexible material, wherein the beverage is dispensed from the second part, which beverage dispensing system, furthermore, is connectable to a container in which the beverage is stored, which is adapted to receive one end of the cartridge unit for the dispensation of beverage, whereby beverage can be dispensed from the container via the cartridge unit, and the system furthermore comprising:

a valve means, which is adapted to open and/or close the flow of beverage by interaction with the second flexible part of the cartridge unit upon shifting a valve control means from an "open" to a "closed" position, wherein the beverage dispensing system furthermore comprises an installation means, which, when the valve control means is in the "closed" position, keeps the valve means in the open position, when the cartridge unit is not inserted in the container, but closes the valve means, when the cartridge unit is inserted into the container.

4. A beverage dispensing system according to claim 3, wherein the closing of the valve, when the cartridge unit is inserted into the container, is achieved in that the first inflexible part of the cartridge unit interacts with a lever means which shifts the valve means from the open to the closed position.

5. A beverage dispensing system according to claim 3, wherein the installation means comprises a holding means, which keeps the valve means in the open position, when the cartridge unit is not inserted in the container.

6. A beverage dispensing system according to claim 3, wherein the valve control means is a handle.

7. A beverage dispensing system according to claim 3, wherein the valve control means is a removable handle.

8. A beverage dispensing system according to claim 3, wherein the installation means comprises a cushioning means, which prevents movement of the cartridge unit via the lever means in case the valve control means is shifted.

9. A beverage dispensing system according to claim 3, further containing a fixation means which keeps the valve control means in a fixed position in the case that the cartridge unit is not inserted.

\* \* \* \* \*